United States Patent [19]

Kikuchi

[11] Patent Number: 4,694,563
[45] Date of Patent: Sep. 22, 1987

[54] PROCESS FOR MAKING SCHOTTKY-BARRIER GATE FET

[75] Inventor: Kenichi Kikuchi, Osaka, Japan

[73] Assignee: Sumitomo Electric Industries, Ltd., Osaka, Japan

[21] Appl. No.: 342,912

[22] Filed: Jan. 26, 1982

[30] Foreign Application Priority Data

Jan. 29, 1981 [JP] Japan .................................. 56-11812
Apr. 24, 1981 [JP] Japan .................................. 56-62999

[51] Int. Cl.⁴ .......................................... H01L 21/265
[52] U.S. Cl. .............................. 437/40; 148/DIG. 84; 357/91; 437/175
[58] Field of Search ............... 29/571, 576 B; 148/1.5, 148/187, DIG. 84; 357/91

[56] References Cited

U.S. PATENT DOCUMENTS

| | | | |
|---|---|---|---|
| 4,173,063 | 11/1979 | Kniekamp et al. | 29/576 B |
| 4,344,980 | 8/1982 | Yoder | 148/1.5 |
| 4,426,765 | 1/1984 | Shahriary | 29/571 |
| 4,503,599 | 3/1985 | Ueyanagi et al. | 29/571 |
| 4,532,695 | 8/1985 | Schuermeyer | 29/571 |
| 4,546,540 | 10/1985 | Ueyanagi et al. | 29/571 |
| 4,559,238 | 12/1985 | Bujatti et al. | 29/571 |
| 4,601,095 | 7/1986 | Kikuchi et al. | 29/576 B |

OTHER PUBLICATIONS

Lee et al, Appl. Phys. Letts., 37 (1980), 311.
1981 IEEE International Solid-State Circuits Conference, pp. 218-219.
Electronics Letters, 4th February 1982, vol. 18, No. 3, pp. 119-121.

Primary Examiner—Upendra Roy
Attorney, Agent, or Firm—Wenderoth, Lind & Ponack

[57] ABSTRACT

This invention is concerned with an improved Schottky-barrier gate field effect transistor, which comprises a semi-insulating semiconductor substrate, an active layer formed on the surface of the semiconductor substrate and a source electrode, Schottky-barrier gate electrode and drain electrode formed on the active layer, in which the active layer has a first part having such a thickness as to give a predetermined pinch-off voltage and being formed near the gate electrode and a second part having a substantially similar carrier concentration to that of the first part and a larger thickness than the first part and being formed between the Schottky-barrier gate electrode and source electrode, and the upper surfaces of the first part and second part of the active layer are in a same plane.

9 Claims, 15 Drawing Figures

PROCESS FOR MAKING SCHOTTKY-BARRIER GATE FET

BACKGROUND OF THE INVENTION

1. Field of the Invention

This invention relates to an improvement in a Schottky-barrier gate field effect transistor and a process for the production of the same.

2. Description of the Prior Art

Schottky-barrier gate field effect transistors (which will hereinafter be referred to as "MESFET" simply) have widely been used as an element for amplification or oscillation, in particular, in microwaves, and as well known in the art, are excellent as a basic element for an integrated circuit of ultra-high speed operation.

The structure of the most commonly used MESFET is as shown in FIG. 1, in which 1 is a high resistance or semi-insulating semiconductor crystal substrate, 2 is an electrically conductive semiconductor crystal layer generally called an active layer, 3 is a Schottky-barrier gate electrode and 4 and 5 are respectively a source electrode and drain electrode having ohmic characters. The carrier concentration Nd and thickness a of the active layer 2 have a relationship with the pinch-off voltage Vp of MESFET, represented by the following formula (1):

$$Vp = Vb - [(qNd)/(2\epsilon)]a^2$$

where Vb is a built-in voltage, $\epsilon$ is a dielectric constant of semiconductor and q is an electronic charge.

Vp is given from the requirements of a circuit design and Nd and a are determined using the formula (1) so as to satisfy the value of Vp.

One disadvantage of the prior art structure as shown in FIG. 1 is that the transconductance gm obtained is not sufficiently large and the noise characteristic is deteriorated, because the resistance between gate 3 and source 4 or gate 3 and drain 5 is high. In particular, where the absolute value of the pinch-off voltage Vp is small or in the case of "normally off" (Vp>0), Nd- and a-values should be small and thus the series resistance between a gate and source is larger as is evident from the formula (1). When active layer 2 is of GaAs crystal, there is a high density surface state on crystal surface areas 6 and 7 between a gate and source and between a gate and drain, whereby the surface potential is substantially fixed and a depletion layer is formed near the surface of the semiconductor crystal, resulting in a larger series resistance between a gate and source. This is a very important problem.

As a method of solving this problem, it has hitherto been proposed to make thicker active layers 9 and 10 between a gate and source and between a gate and drain than active layer 8 directly under the gate, as shown in FIG. 2. According to this method, however, it is required to determine the thickness of active layer 8 and the carrier concentration so as to satisfy the condition of the formula (1), but it is difficult to control precisely and reproducibly the thickness of the part 8 in such a recess structure by etching and the like in view of the present technical level. This structure is obtained by forming a uniform active layer having a thickness desired for the portion directly under source electrode 4 and drain electrode 5, making thinner only part 8 to be directly under gate electrode 3 by etching and the like and then forming electrodes 4, 5 and 3. However, this structure has the disadvantage that not only a fine photolithography for forming an electrode is difficult, but also a much severer precision is required for etching control of an active layer thus resulting in a lowered yield, because the surface of the active layer is not flat.

SUMMARY OF THE INVENTION

It is an object of the present invention to provide an improved Schottky-barrier gate field effect transistor whereby the prior art disadvantages can be overcome.

It is another object of the present invention to provide a Schottky-barrier gate field effect transistor excellent in microwave properties as well as in yield.

It is a further object of the present invention to provide a process for the production of an improved Schottky-barrier gate field effect transistor.

These objects can be attained by a Schottky-barrier gate field effect transistor comprising a semi-insulating semiconductor substrate, an active layer formed on the surface of the semiconductor substrate, and a source electrode, Schottky-barrier gate electrode and drain electrode formed on the active layer, in which the active layer has a first part having such a thickness as to give a predetermined pinch-off voltage and being formed near the gate electrode and a second part having a substantially similar carrier concentration to that of the first part and a larger thickness than the first part and being formed between the Schottky-barrier gate electrode and source electrode, and the upper surfaces of the first part and second part of the active layer are in a same plane.

BRIEF DESCRIPTION OF THE DRAWING

The accompanying drawings are to illustrate the principle and merits of the present invention is more detail.

DETAILED DESCRIPTION OF THE INVENTION

In a Schottky-barrier gate field effect transistor comprising a semi-insulating semiconductor substrate, an active layer formed on the surface of the semiconductor substrate, and a source electrode, Schottky-barrier gate electrode and drain electrode formed on the active layer, according to the present invention, the active layer has a first part having such a thickness as to give a predetermined pinch-off voltage and being formed near the Schottky-barrier gate electrode and a second part having a substantially similar carrier concentration to the first part and a larger thickness than the first part and being formed between the Schottky-barrier gate electrode and source electrode, and the upper surfaces of the first part and second part of the active layer are in a same plane.

In addition, according to the present invention, there is provided a process for the production of a Schottky-barrier gate field effect transistor, which comprises forming a first active layer of one electrically conductive type semiconductor crystal with a thickness and carrier concentration chosen so as to give a predetermined pinch-off voltage, forming a pattern thereon, introducing an impurity for giving the same electrically conductive type as the first active layer into the first active layer by ion implantation or thermal diffusion selectively through the pattern as a mask to form a second deeper active layer, and then forming electrodes.

The present invention will now be illustrated in more detail through the embodiments of the present invention.

Figure 3:
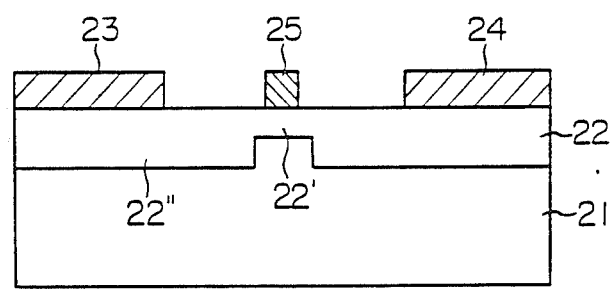
FIG. 3 is a cross sectional view of the first embodiment of the field effect transistor according to the present invention.

FIG. 3 is a cross-sectional view of the first embodiment of the Schottky-barrier gate field effect transistor according to the present invention, which comprises a semi-insulating semiconductor substrate 21 such as GaAs, an n-type active layer 22, a source electrode 23, a drain electrode 24 and a Schottky-barrier gate electrode 25. In the field effect transistor of the present invention, as shown in FIG. 3 for example, a part of active layer (second part) 22'' having a larger thickness than another part of active layer (first part) 22' directly under the gate electrode is formed near source electrode 23 and drain electrode 24 while keeping flat the surface of active layer 22. Since the surface of active layer 22 is flat, a fine photolithography is easy and the yield is thus increased in the formation of electrodes 23, 24 and 25 or in the production of integrated circuits, for example, monolithic microwave IC such as microwave receiver heads with a mixer diode, and high speed digital IC.

Figure 4A:
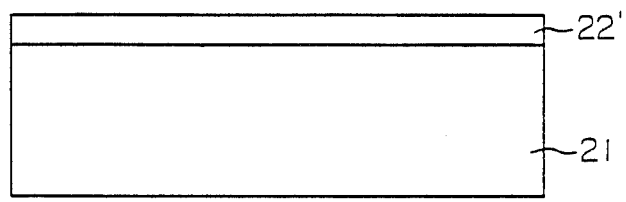
FIGS. 4(A), (B) and (C) are cross sectional views to illustrate in order the steps of making the transistor of the present invention shown in FIG. 3.

FIGS. 4(A), (B) and (C) are cross sectional views to illustrate a method of making the field effect transistor shown in FIG. 3. Referring to FIG. 4(A), $^{28}Si^+$ ion is implanted in the surface of a semi-insulating substrate 21 of GaAs to form active layer 22' with a uniform thickness. The thickness and carrier concentration of this active layer are so chosen as to realize a desired pinch-off voltage of preferably $+0.3$ to $-3$ V. For example, it is required for obtaining a pinch-off voltage of $-2.2$ V. to form an active layer with a carrier concentration of $10^{17}$ cm$^{-3}$ and a thickness of 0.1 $\mu$m approximately and implantation therefor is carried out, for example, with an implantation energy of 120 KeV and an implantation quantity of $2 \times 10^{12}$ dose/cm$^2$ where the doping efficiency is regarded as 100%. The theoretical value of the carrier concentration distribution obtained under these conditions is shown by chain line 31 in FIG. 5.

Figure 4B:
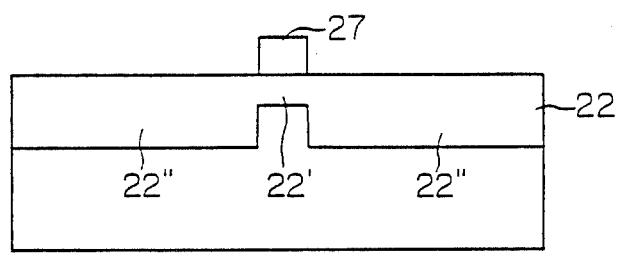

As exemplified in FIG. 4(B), after active layer 22' with a uniform thickness is formed, pattern 27 of photoresist is formed thereon. Using this pattern 27 as a mask, the second ion implantation is carried out to form a new active layer 22'' on the non-masked site. The conditions for the second ion implantation are so chosen that the implantation energy is larger than that of the first implantation to implant more deeply and the implantation quantity is determined in such a range that the final peak carrier concentration is not too large to prevent a dielectric breakdown by a voltage applied to the gate and an increase of gate capacitance. When an implantation energy of 400 KeV and an implantation quantity of $3.9 \times 10^{12}$ dose/cm$^2$ are chosen as such implantation conditions, for example, the theoretical value of the carrier concentration distribution is shown by broken line 32 in FIG. 5. The concentration of non-masked part 22'' in active layer 22 corresponds to the sum of the concentration by the first ion implantation plus that by the second ion implantation, which distribution is shown by solid line 33 in FIG. 5.

Figure 4C:
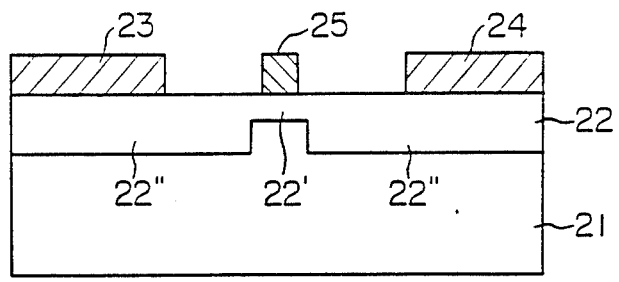

Referring to FIG. 4(C), the method is completed by removing mask 27, electrically activating the implanted ions by annealing, and then forming source electrode 23, drain electrode 24 and gate electrode 25 on a predetermined site of the flat active layer 22 by the use of a mask formed for electrodes.

Figure 5:
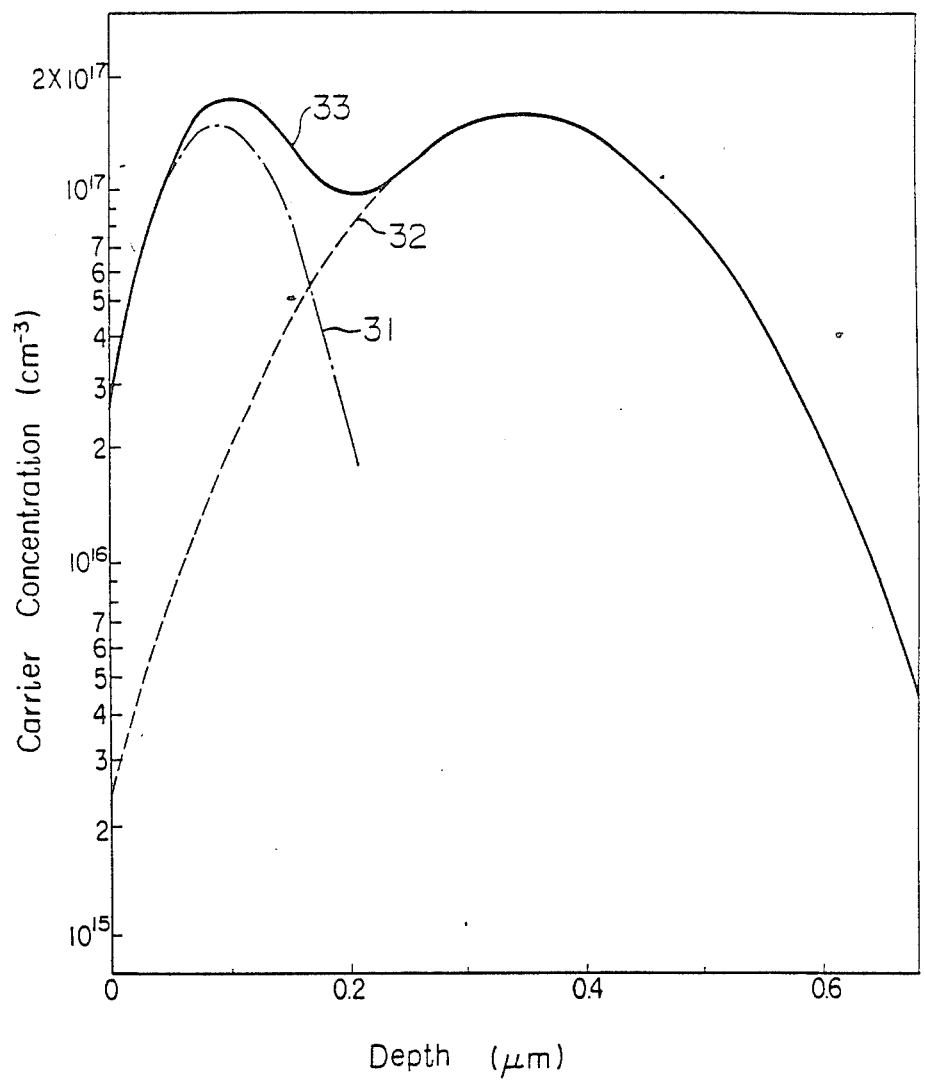
FIG. 5 is a graph showing a carrier concentration distribution in an active layer.

As can be seen from FIG. 5, the total number of carriers in active layer 22'' near source electrode 23 are about three times more than that in active layer 22' directly under gate electrode 25 and, consequently, the resistance between a gate and source is decreased to $\frac{1}{3}$ or less as compared with the case where active layer 22' is uniformly formed. On the other hand, since the peak carrier concentration in active layer 22'' becomes only about 13% more than that in active layer 22', decrease of the breakdown voltage of a gate and increase of the capacitance of a gate are held small.

An example of making the field effect transistor having the structure shown in FIG. 3 by the ion implantation method has been illustrated above, but it can be produced by the thermal diffusion method. That is, a shallow diffusion layer corresponding to active layer 22' of FIG. 4(A) is firstly formed by contacting a dopant with a small diffusion constant with the surface of a substrate, followed by thermal diffusion, a mixed diffusion layer consisting of a shallow diffusion layer and a deep diffusion layer corresponding to active layer 22'' of FIG. 4(B) is then formed by contacting another dopant with a large diffusion constant with the site not directly under a gate using a mask, followed by thermal diffusion, and finally, electrodes 23, 24 and 25 are formed. Alternatively, the structure of FIG. 3 can be realized by depositing a dopant with a small diffusion constant on a gate part while depositing another dopant with a large diffusion constant on between a gate and source and then subjecting both zones to thermal diffusion simultaneously.

The shorter is the length of active layer 22' in FIG. 3, the larger is the value of gm. This is a favourable character. However, shortening of this length is limited by the fine photolithograpty.

The relationship between the length of active layer 22' and that of gate electrode 25 will now be illustrated. In the case of a "normally on" type, which has a relatively thick active layer 22', even if the length of active layer 22' is somewhat longer than that of gate electrode 25, the properties are not significantly deteriorated because such a problem does not arise that the part of active layer 22' not directly under a gate increases extremely the resistance between the gate and source since active layer 22' is relatively thick and the thickness of a depletion layer from the surface toward the inside does not exceed to the whole thickness of active layer 22'. On the contrary, in the case of a "normally off" type, in which the shallow active layer 22' is relatively thin, if the length of the shallow active layer 22' is greater than that of gate electrode 25, the depletion layer in the region not directly beneath the gate will extend completely to the bottom of the shallow active layer, thus resulting in a marked increase of the resistance between the gate and source and in an extreme case, breaking completely current.

Figure 6:
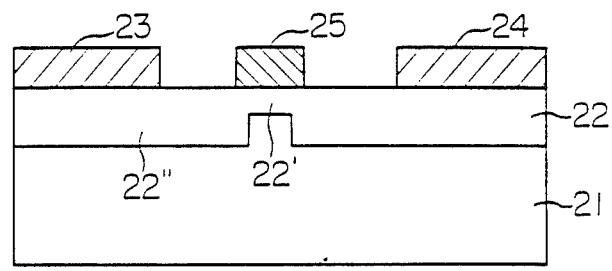
FIG. 6 is a cross sectional view of a preferred embodiment of the field effect transistor according to the present invention.

In order to solve such a problem, it is proposed as a preferable embodiment to form an active layer 22' with a shorter length than that of a gate electrode 25 as exemplified in FIG. 6 in which the numeral indication of the each element corresponds to FIG. 3. This embodiment is of a "normally off" type.

The second embodiment of the present invention will now be illustrated. With the decrease of the length of active layer 22', gm of the field effect transistor is increased and a high gain and high speed operation are possible. An effective method of shortening the length of active layer 22' is given below.

Figure 7:
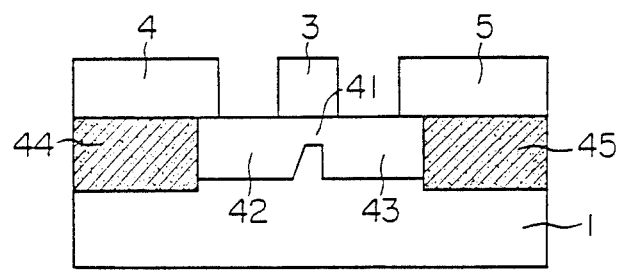
FIG. 7 is a cross sectional view of the second embodiment of the field effect transistor according to the present invention.

FIG. 7 shows a cross sectional view of the structure of a field effect transistor according to one embodiment of the present invention. MESFET having this structure according to the present invention shows a low series resistance due to the presence of deep active layers 42 and 43 and thus is excellent in transconductance gm as well as high frequency properties. Since the effective gate length depends on the length of shallow active layer 41 and shortening of this length can readily be effected according to this embodiment, more excellent high frequency characteristics can be given.

Figure 8A:
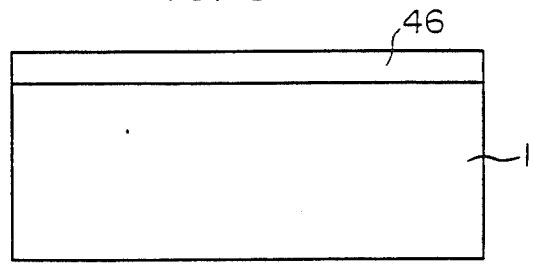
FIGS. 8(A), (B), (C), (D) and (E) are cross sectional views to illustrate in order the steps of making the transistor of the present invention shown in FIG. 7.

FIGS. 8(A), (B), (C) (D) and (E) are cross sectional views to illustrate a process of making MESFET according to the present invention. Referring to FIG. 8(A), on the surface of a high resistivity or semi-insulating semiconductor crystal substrate 1 is formed one electrically conductive type (n- or p-type) semiconductor crystal layer 46 with such a thickness and carrier concentration that a desired pinch-off voltage Vp, e.g. +0.3 to −3 V, be obtained according to the formula (1). Preparation of semiconductor crystal layer 46 is generally carried out by the vopor phase epitaxial method, liquid phase epitaxial method or method of implanting an impurity ion in semi-insulating substrate 1. When $^{28}Si^+$ ion is implanted in a semi-insulating semiconductor substrate of GaAs to obtain an active layer (normally off) with a pinch-off voltage of 0 V, for example, the implanation is carried out with a $^{28}Si^+$ implantation quantity of $5.5 \times 10^{11}$ dose/cm$^2$ and an implantation energy of 120 KeV where the doping efficiency is regarded as 100%. The theoretical value of the carrier concentration distribution obtained under these conditions is shown by solid line 56 in FIG. 9 in which the abscissa represents the distance, i.e. depth from the surface of the semiconductor crystal layer ($\mu$m) and the ordinate represents the carrier concentration (cm$^{-3}$).

Figure 8B:
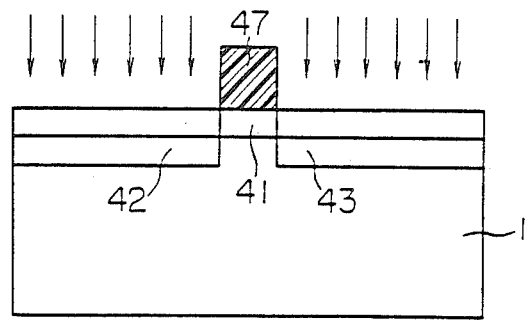

Then stripe-like mask 47 is formed on the surface of the above described crystal layer 46 as shown in FIG. 8(B). As the material of mask 47, photoresists and resists for electron beam lithography are suitable, but any other materials can also be used which are capable of being used as a selective mask for ion implantation, and being readily formed and stripped. An impurity capable of giving the same conductive type as crystal layer 46 is introduced into the crystal substrate by the ion implantation method or thermal diffusion method using mask 47 to form deep active layers 42 and 43. When the thermal diffusion method is employed, a material having a sufficient heat resistance such as SiO$_2$, Si$_3$N$_4$ and the like should of course be used.

When the above described deep active layer is formed by ion implantation, the implantation energy is made larger than that used for the ion implantation of shallow active layer 46 so as to obtain a deeper implantation than in shallow active layer 46 and the implantation quantity is preferably chosen in such a range that the final peak carrier concentration is not too large to prevent a dielectric breakdown by a voltage applied to a gate and an excessive increase of gate capacitance. When an implantation energy of 400 KeV and an implantation quantity of $1.07 \times 10^{12}$ dose/cm$^2$ are chosen as such implantation conditions, for example, the theoretical value of the carrier concentration distribution is shown by broken line 57 in FIG. 9. The concentration of non-masked parts 42 and 43 corresponds to the sum of the concentration by the first shallow ion implantation plus that by the second deep ion implantation, which distribution is shown by chain line 58 in FIG. 9.

Figure 1:
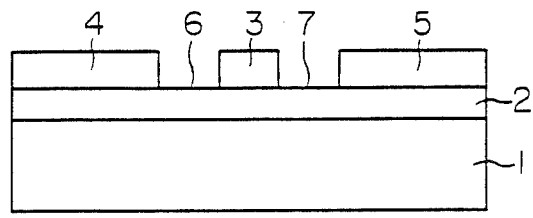
FIG. 1 and FIG. 2 are cross sectional views of the prior art transistors.
Figure 2:
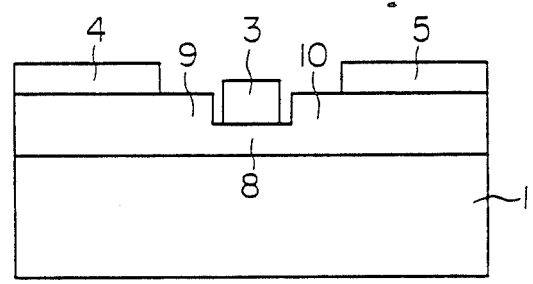
Figure 9:
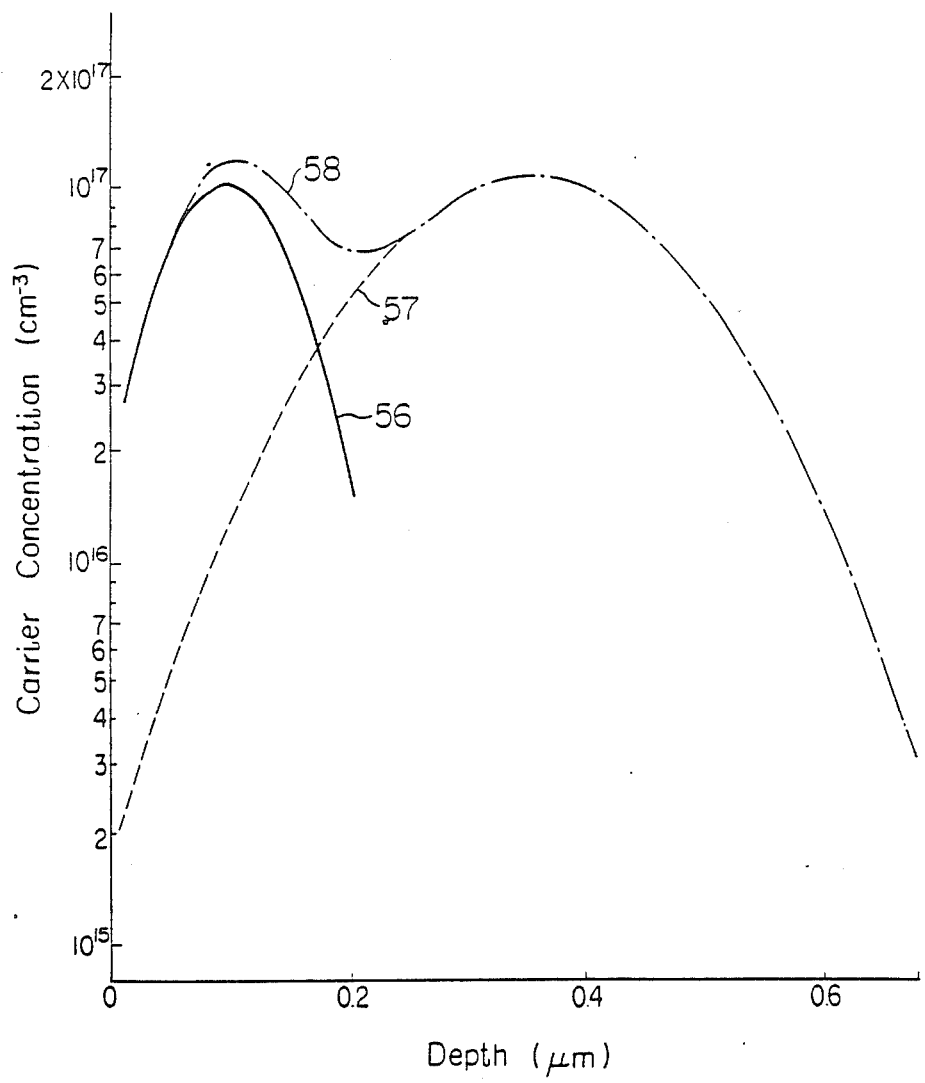
FIG. 9 is a graph showing a carrier concentration distribution in an active layer.

As can be seen from FIG. 9, the total number of carriers in deep active layers 42 and 43 is about three times higher than that in the main active layer 41 for giving a pinch-off voltage and, consequently, the resistance between a gate and source can be decreased to $\frac{1}{3}$ or less as compared with the prior art method wherein active layers 42 and 43 are formed in the same manner as active layer 41 as shown in FIG. 1. If the second ion implantation is carried out with a larger dose, the gate-source resistance can further be decreased, but it is necessary to choose a suitable dose in order to prevent that the carrier concentration is extremely large, the breakdown voltage of a gate is smaller than a desired value and the gate capacitance is large.

Figure 8C:
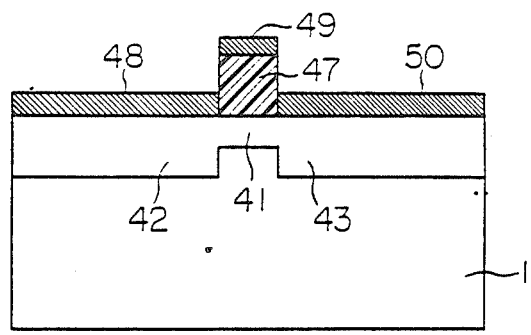
Figure 8D:
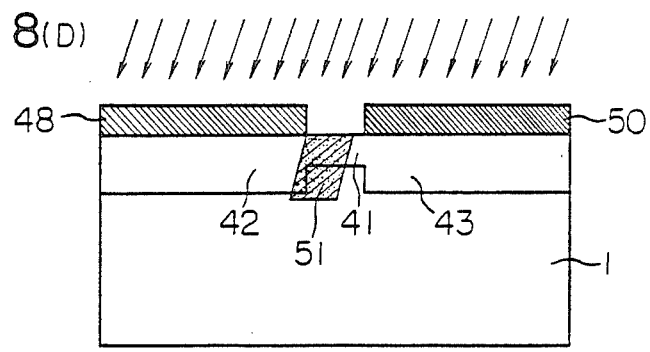

Then, metallic films 48, 49 and 50 such as Al film are vapor-deposited onto the whole surface of the substrate as shown in FIG. 8(C) and, thereafter, mask 47 is removed by the use of a suitable solvent, for example, organic solvents in the case of photoresists while vapor-deposited film 49 on mask 47 is simultaneously removed (lift off), thus obtaining vapor-deposited film patterns 48 and 50 to be a reversal image of mask 47 as shown in FIG. 8(D). Using metallic films 48 and 50 as a masking material, ion implantation is then carried out in a slant direction as shown in the figure so that a part of window 51 has substantially the same carrier concentration distribution as deep active layers 42 and 43. In this case, it is important to effect the ion implantation in a slant direction by all means so that a shallow part remains. This remaining shallow active layer will later be used as a main active layer to give a pinch-off voltage. It will apparently be understood that the length of the shallow main active layer 41 can be controlled easily and precisely by selecting suitably the implanting angle and the thickness of mask 50. For example, when the thickness of mask is 5000 Å and the implanting angle is 30° from vertical, the length of main active layer 41 becomes about 2900 Å. Practically, the length of active layer 41 is further shorter than the above described value because the implanted atoms are scattered laterally too.

In the prior art lithography, it is difficult to make an MESFET having a gate length of 0.5 $\mu$m with a high reproducibility, so it is more difficult to make an IC of an MESFET with a short gate length. According to the method of the present invention, however, an active layer with a short effective gate length can be obtained with a high reproducibility as well as a high yield. Since masks 48 and 50 are only used as a masking material for ion implantation, any other materials capable of interrupting implanted ions and being readily formed and removed can be used in addition to Al. Examples of such a masking material are Au, Ti, Mo, Ta, etc.

Figure 8E:
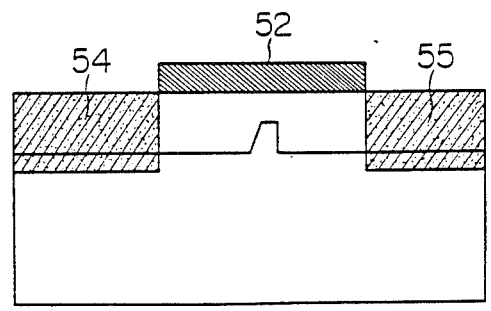

After removing masks 48 and 50, high impurity layers 54 and 55 are selectively formed on a part to be an ohmic contact part by the ion implantation method or thermal diffusion method, preferably using mask 52 as shown in FIG. 8(E), mask 52 is then removed and the implanted layer is subjected to annealing for activation. When the crystal material is a compound semiconductor such as GaAs, InP and the like, the anneal should be carried out under coating with e.g. $Si_3N_4$ film and/or controlling a pressure of As or P for the purpose of protecting the crystal surface.

After annealing, gate electrode 3, source electrode 4 and drain electrode 5 are formed in conventional manner to give an MESFET as shown in FIG. 7.

This embodiment is commercially important since according to this embodiment, an MESFET with a short gate length and small series resistance between a gate and source can be made easily with a high reproducibility.

In the foregoing embodiments of the present invention, GaAs is used as a semiconductor crystal, but if necessary, InP or other Group III–Group V compound semiconductors or other semiconductors such as Si can of course be used.

As apparent from the foregoing detailed description, according to the present invention, there is provided an MESFET which is excellent in high frequency characteristics, exhibits a high breakdown voltage and can be produced with a high yield, because an active layer between a gate and source is thick, the carrier concentration is substantially constant over the whole active layer and the surface of the active layer is made flat.

What is claimed is:

1. A process for the production of a Schottky-barrier gate field effect transistor, which comprises forming a first active layer of one electrically conductive type semiconductor crystal with a thickness and carrier concentration chosen so as to give a predetermined pinch-off voltage, forming a pattern thereon, introducing an impurity for giving the same electrically conductive type as the first active layer into the first active layer by ion implantation or thermal diffusion selectively through the pattern as a mask to form a second deeper active layer at both sides of the first active layer such that the second active layer has a surface carrier concentration substantially equal to that of the first active layer, and then forming electrodes.

2. A process for the production of a Schottky-barrier gate field effect transistor, which comprises forming a first active layer of one electrically conductive type semiconductor crystal with a thickness and carrier concentration chosen so as to give a predetermined pinch-off voltage, forming a stripe-like resist pattern thereon, introducing an impurity for giving the same electrically conductive type as the first active layer into the first active layer by ion implantation or thermal diffusion selectively through the pattern as a mask to form a second deeper active layer at both sides of the first active layer such that the second active layer has a surface carrier concentration substantially equal to that of the first active layer, removing the pattern and then forming a source electrode, drain electrode and gate electrode on the resulting level active layer.

3. The process of claim 1 or claim 2, wherein the first active layer is formed by implanting $^{28}Si^+$ ion uniformly in semi-insulating GaAs substrate.

4. The process of claim 1 or claim 2, wherein the pinch-off voltage ranges form +0.3 to −3 V.

5. The process of claim 1 or claim 2, wherein the second active layer is formed by a deeper ion implantation than in the formation of the first active layer.

6. A process for the production of a Schottky-barrier gate field effect transistor, which comprises forming a first active layer of one electrically conductive type semiconductor crystal with a thickness and carrier concentration chosen so as to give a predetermined pinch-off voltage, forming a stripe-like resist pattern thereon, introducing an impurity for giving the same electrically conductive type as the first active layer into the first active layer by ion implantation or thermal diffusion selectively through the pattern as a mask to form a second deeper active layer at both sides of the first active layer such that the second active layer has a surface carrier concentration substantially equal to that of the first active layer, forming a pattern reversed rightly to the resist pattern by the lift off method, introducing an impurity for giving the same electrically conductive type as the first active layer into a part of the window part through the reversed pattern as a mask by slant ion implantation, removing the reversed pattern, subjecting to annealing for the electrical activation of the ion-implanted impurity forming a Schottky-barrier electrode and forming a source electrode and a drain electrode.

7. The process of claim 6, wherein the reversed pattern is formed by vapor deposition of a metal selected from the group consisting of Al, Ta, Mo, W and Ti, followed by lift off.

8. The process of claim 6, wherein the annealing is carried out while protecting the crystal surface by coating with $Si_3N_4$ or by controlling the pressure of As or P.

9. The process of claim 6, wherein the annealing is carried out at a temperature of 700° to 850° C.

* * * * *